United States Patent
Mori et al.

(10) Patent No.: US 7,547,620 B2
(45) Date of Patent: Jun. 16, 2009

(54) FILM PATTERN PRODUCING METHOD, AND PRODUCING METHOD FOR ELECTRONIC DEVICE, ELECTRON-EMITTING DEVICE AND ELECTRON SOURCE SUBSTRATE UTILIZING THE SAME

(75) Inventors: Shosei Mori, Hiratsuka (JP); Tsuyoshi Furuse, Isehara (JP); Masahiro Terada, Hadano (JP); Takeru Mizue, Atsugi (JP); Kazuhiro Kagami, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 182 days.

(21) Appl. No.: 11/214,944

(22) Filed: Aug. 31, 2005

(65) Prior Publication Data
US 2006/0046208 A1  Mar. 2, 2006

(30) Foreign Application Priority Data
Sep. 1, 2004  (JP)  ............................. 2004-253985

(51) Int. Cl.
*H01L 21/20* (2006.01)
(52) U.S. Cl. ..................................... 438/584
(58) Field of Classification Search .................. 438/584
See application file for complete search history.

(56) References Cited

U.S. PATENT DOCUMENTS

| | | | |
|---|---|---|---|
| 5,622,634 A * | 4/1997 | Noma et al. | 216/40 |
| 6,106,906 A * | 8/2000 | Matsuda et al. | 427/558 |
| 6,435,928 B1 * | 8/2002 | Tsukamoto | 445/24 |
| 6,626,719 B2 * | 9/2003 | Ono et al. | 445/24 |
| 6,737,287 B1 | 5/2004 | Furuse et al. | 438/21 |
| 6,900,581 B2 * | 5/2005 | Kyogaku et al. | 313/310 |
| 6,960,111 B2 * | 11/2005 | Takegami et al. | 445/24 |
| 2002/0042240 A1 * | 4/2002 | Fujimura et al. | 445/24 |
| 2002/0047574 A1 * | 4/2002 | Kojima et al. | 315/169.3 |
| 2002/0057046 A1 * | 5/2002 | Yamamoto et al. | 313/311 |
| 2003/0060114 A1 * | 3/2003 | Yanagisawa et al. | 445/24 |
| 2003/0227251 A1 * | 12/2003 | Ishizuka et al. | 313/495 |
| 2004/0020689 A1 * | 2/2004 | Kagami et al. | 174/261 |
| 2004/0087239 A1 * | 5/2004 | Shimoda et al. | 445/50 |
| 2004/0259038 A1 * | 12/2004 | Watanabe et al. | 430/313 |
| 2005/0279994 A1 * | 12/2005 | Ueda et al. | 257/33 |
| 2006/0045960 A1 * | 3/2006 | Furuse et al. | 427/66 |
| 2006/0148369 A1 * | 7/2006 | Shinozaki | 445/50 |
| 2006/0246738 A1 * | 11/2006 | Isobe et al. | 438/769 |

FOREIGN PATENT DOCUMENTS

| | | |
|---|---|---|
| JP | 2001-319568 | 11/2001 |
| JP | 2003/036781 | 2/2003 |
| JP | 2004-096106 | 3/2004 |

OTHER PUBLICATIONS

Translation of JPP 2000-243254, published Sep. 8, 2000.

* cited by examiner

*Primary Examiner*—N Drew Richards
*Assistant Examiner*—Ankush K Singal
(74) *Attorney, Agent, or Firm*—Fitzpatrick, Cella, Harper & Scinto

(57) ABSTRACT

A method for producing a film pattern comprises a step of forming a resin film on a substrate surface; a step of incorporating into the resin film a constituent of a conductive film or a semiconductor film; a step of irradiating the resin film with an ultraviolet light; and a step of heating the resin film at a temperature not lower than a decomposition temperature of the resin to form a conductive film or a semiconductor film on the substrate, whereby the resin does not easily generate decomposition residues to improve precision and quality of the produced film pattern.

13 Claims, 2 Drawing Sheets

FILM PATTERN PRODUCING METHOD, AND PRODUCING METHOD FOR ELECTRONIC DEVICE, ELECTRON-EMITTING DEVICE AND ELECTRON SOURCE SUBSTRATE UTILIZING THE SAME

BACKGROUND OF THE INVENTION

1. Field of the Invention

The present invention relates to a method for producing a film pattern that can be utilized for forming an electrode, a wiring or a component for an electron-emitting device, formed as a patterned conductive film, or for forming a patterned semiconductor film in a thin film transistor, and a producing method for an electronic device, an electron-emitting device, an electron source substrate and an image forming apparatus, utilizing the same.

2. Related Background Art

It is already known to obtain a conductive film pattern on a substrate by forming a resin pattern with a photosensitive resin on the substrate, causing the resin pattern to absorb a solution containing a metal component and baking such resin pattern, and to produce an electron-emitting device, an electron source substrate or an image forming apparatus, by utilizing such film pattern formation (for example cf. Japanese Patent Application Laid-open No. 2003-36781).

However, a film pattern formation by such prior method tends to result in a fluctuation in the pattern, and is not sufficient in a pattern precision for use in a wiring or an electrode of a high definition image forming apparatus.

SUMMARY OF THE INVENTION

An object of the present invention is to suppress a fluctuation in the obtained film pattern thereby enabling to obtain a highly precise pattern.

The present invention provides a method for producing a film pattern comprises a step of forming a resin film on a substrate surface; a step of incorporating into the resin film a constituent of a conductive film or a semiconductor film; a step of irradiating the resin film with an ultraviolet light; and a step of heating the resin film at a temperature not lower than a decomposition temperature of the resin to form a conductive film or a semiconductor film on the substrate, whereby the resin does not easily generate decomposition residues to improve precision and quality of the produced film pattern.

The present invention also provides a method of producing a film pattern comprising: a step of forming a resin film on a substrate; a step of incorporating into the resin film a liquid containing a constituent of a conductive film or a semiconductor film; and a step of baking the resin film to form a conductive film or a semiconductor film, wherein, step of incorporating into the resin film the liquid containing the constituent of a conductive film or the semiconductor film, the resin film containing the constituent of the conductive film or the semiconductor film is irradiated with an ultraviolet light before the resin film is heated to a decomposition temperature of the resin.

DETAILED DESCRIPTION OF THE PREFERRED EMBODIMENTS

Figure 1A:
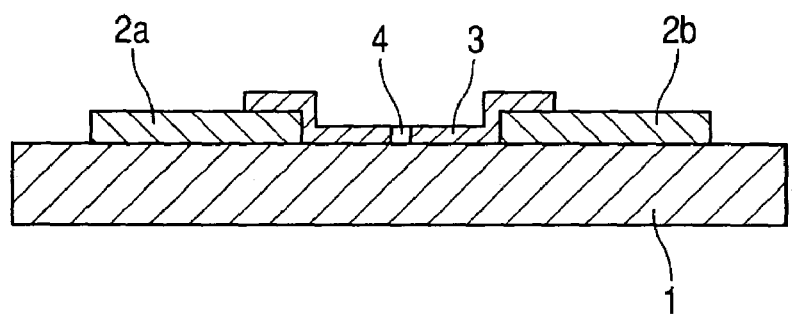
FIGS. 1A and 1B are respectively a cross-sectional view and a plan view, showing a configuration of an electron-emitting device that can be produced with a film pattern forming method of the invention.

The present invention has been made by a finding that a fluctuation in the obtained film pattern has been caused by a decomposition residue of the resin constituting the resin pattern.

Therefore, the present invention provides a method for producing a film pattern comprising: a step of forming a resin film on a substrate surface; a step of incorporating into the resin film a constituent of a conductive film or a semiconductor film; a step of irradiating the resin film with an ultraviolet light; and a step of heating the resin film at a temperature not lower than a decomposition temperature of the resin to form a conductive film or a semiconductor film on the substrate.

The present invention also provides a method of producing a film pattern comprising: a step of forming a resin film on a substrate; a step of incorporating into the resin film a liquid containing a constituent of a conductive film or a semiconductor film; and a step of baking the resin film to form a conductive film or a semiconductor film, wherein, step of incorporating into the resin film the liquid containing the constituent of a conductive film or the semiconductor film, the resin film containing the constituent of the conductive film or the semiconductor film is irradiated with an ultraviolet light before the resin film is heated to a decomposition temperature of the resin.

Further, the present invention provides a producing method for an electronic device, an electron-emitting device, an electron source substrate and an image forming apparatus, utilizing the aforementioned film pattern producing method.

According to the invention, the constituent resin of the resin pattern is rendered easily thermally decomposable by the ultraviolet irradiation, prior to the thermal decomposition in the baking step, and does not easily generate decomposition residue, thereby improving a precision of the obtained film pattern.

In the invention, the irradiation of the resin film with the ultraviolet light is executed after the step of impregnating the resin film with the constituent of the conductive film or the semiconductor film, and before the resin film is heated to the decomposition temperature of the constituent resin thereof. Therefore, the ultraviolet irradiation may be executed, after the step of impregnating the resin film with the constituent of the conductive film or the semiconductor film, either prior to the heating of the resin film in the baking step or after the start of the heating in the baking step but before the resin film is heated to the decomposition temperature of the constituent resin. Such ultraviolet irradiation allows to form a fine film pattern uniformly and little fluctuation, and, for example in the preparation of a display apparatus, to achieve a high definition. Also such method, being simple, can be executed in an inexpensive apparatus and can also suppress an amount of use of the film pattern forming material.

A liquid to be employed in the embodiment of the invention contains a component constituting the conductive film or the semiconductor film, and may be, as long as capable of forming a conductive film or a semiconductor film by a baking, an organic solvent solution based on an organic solvent type solvent containing an organic solvent by 50 wt.% or more, or an aqueous solution based on an aqueous solvent containing water by 50 wt. % or more. In the present invention, a metal means to include an alloy.

The present invention can form a conductive or semiconductor film pattern, which can be utilized for forming an electrode, a wiring, a device film of a surface conduction electron-emitting device, or a patterned semiconductor film in a thin film transistor. More specifically, the present invention is applicable to the production of an electronic device, an electron-emitting device, an electron source substrate or an image forming apparatus.

An electronic device means an apparatus equipped with a substrate provided with a circuit including a conductive or semiconductor film pattern in at least a part thereof, and includes, for example, a liquid crystal display panel and a computer.

The present invention is further applicable to the production of an electron-emitting device, an electron source substrate provided with a plurality of such electron-emitting devices, and an image forming apparatus employing the electron source substrate.

An example of the electron-emitting device is a surface conduction electron-emitting device, which is constructed by forming a conductive film in connection with a pair of device electrodes formed in mutually opposed positions on an electrically insulating substrate, and then applying an energization process, called a forming process, to the conductive film to locally destruct, deform or denature the conductive film thereby forming a portion of a high electrical resistance including a fissure, and which shows a phenomenon of an electron emission from the portion of electrical high resistance including the fissure (electron emitting portion) when a current is supplied along the conductive film. The present invention is applicable not only to the aforementioned surface conduction electron-emitting device, but also to other electron-emitting devices having a conductive film pattern as a constituent. Such other electron-emitting devices include an electron-emitting device of a field emission (FE) type, and an electron-emitting device having a metal/insulator/metal (MIM) configuration.

An electron source substrate is a substrate provided with a plurality of electron-emitting devices and a wiring for driving the electron-emitting devices, and, in case at least a part of the electron-emitting devices and the wiring is constituted of a film pattern, such electron source substrate can be produced by forming at least a part of such film pattern by the film pattern forming method of the present invention.

An electron source substrate, utilizing the aforementioned surface conduction electron-emitting device, includes a ladder-shape configuration in which plural electron-emitting devices, each having a pair of device electrodes, are arranged along an X-direction and a Y-direction of a matrix pattern, and one of the device electrodes and the other thereof in each of the plural electron-emitting devices in a same row are respectively connected to common wirings. In the electron source substrate of such ladder-shaped configuration, it is possible, by providing a control electrode (also called a grid) above each electron-emitting device, to control, among the electron-emitting devices driven for each row, the device from which the electrons are to be emitted.

Also there is known an electron source substrate of so-called single matrix arrangement, in which plural electron-emitting devices are arranged along an X-direction and a Y-direction of a matrix pattern, and one of the device electrodes in each of the plural electron-emitting devices in a same row is commonly connected to a wiring in the X-direction, while the other device electrode in each of the plural electron-emitting devices in a same column is connected commonly to a wiring in the Y-direction.

Also an image forming apparatus is known to be formed by combining, in a mutually opposed relationship, such electron source and an image forming member which forms an image by the irradiation of an electron beam emitted from the electron-emitting device of the electron source. A display panel usable as a television or a computer display can be obtained by utilizing, as the image forming member, a member having a phosphor which emits a visible light by the electrons. Also there can be obtained a copying machine or a printer by employing a photosensitive drum as the image forming member and by developing a latent image, formed on the photosensitive drum by the irradiation with the electron beam, with a toner.

The present invention will be further clarified in the following.

(1) Resin Film Forming Material

A resin film forming material to be employed in the present invention can be a photosensitive resin. The photosensitive resin to be employed is not particularly restricted as long as a resin film formed with such resin can absorb a liquid containing a component for constituting the conductive film or the semiconductor film as will be explained later, and may be a water-soluble photosensitive resin or a solvent-soluble photosensitive resin. A water-soluble photosensitive resin means a photosensitive resin which can be developed, in a development step to be explained later, with water or a developer containing water by 50 wt. % or more, and a solvent-soluble photosensitive resin means a photosensitive resin which can be developed, in the development step, with an organic solvent or a developer containing an organic solvent by 50 wt. % or more.

The photosensitive resin may be of a type containing a photosensitive group in a resin structure, or a type in which a sensitizer is mixed with a resin, such as a cyclized rubber-bisazide resist. In the photosensitive resin of either type, a photoreaction initiator or a photoreaction inhibitor may be suitably mixed. Also there may be employed a type in which a photosensitive resin film soluble in a developer solution becomes insoluble therein by a light irradiation (negative type) or a type in which a photosensitive resin film insoluble in a developer solution becomes soluble therein by a light irradiation (positive type).

In the present invention, general photosensitive resins may be employed widely as explained above, but there is preferred a resin capable of an ion exchange by reacting a film forming component in a solution to be explained later, in order to improve the absorption of a component constituting the conductive film or the semiconductor film, thereby improving the efficiency of utilization of materials, and for forming a pattern of a better shape. A resin capable of ion exchange is a resin having an ion exchanging group, and is particularly preferably a resin having a carboxylic acid group because of the ease for forming a pattern of a better shape. Also a water-soluble photosensitive resin is preferable in consideration of ease of maintaining a satisfactory work environment and a smaller burden of the waste material on the environment.

Further for such water-soluble photosensitive resin, there can be employed a developer solution containing water by 50 wt. % or more and containing a lower alcohol such as methyl alcohol or ethyl alcohol, for increasing the drying speed, within a range less than 50 wt. %, or a developer solution containing a component for promoting dissolution or improving stability of the photosensitive resin component. However, from the standpoint of alleviating an environmental burden, there is preferred a resin developable with a developer solution of a water content of 70 wt. % or higher, more preferably a resin developable with a developer solution of a water content of 90 wt. % or higher, and most preferably a resin developable with water only as the developer. Such water-soluble photosensitive resin can be, for example, formed by a water-soluble resin such as a polyvinyl alcohol resin or a polyvinylpyrrolidone resin.

(2) Liquid Containing Component Constituting Conductive Film or Semiconductor Film A liquid containing a component constituting the conductive film or the semiconductor film, to be employed in the present invention, may be any liquid capable of forming a conductive film or a semiconductor film by drying and baking, and a component for constituting the conductive film or the semiconductor film can be a metal or a metal compound. In consideration of an application to the manufacture of an electronic device, an electron-emitting device, an electron source substrate or an image display apparatus, the component for constituting the conductive film or the semiconductor film is preferably one selected from gold, silver, copper, ruthenium, palladium, rhodium, bismuth, vanadium, chromium, tin, lead, silicon, zinc, indium and nickel. Also the liquid containing such constituent may be an organic solvent solution utilizing a organic solvent type solvent containing an organic solvent by 50 wt. % or more, or an aqueous solution utilizing an aqueous solvent containing water by 50 wt. % or more. The liquid containing the constituent can be easily obtained by dissolving a metalorganic compound such as a metal complex soluble in water or an organic solvent in an aqueous solvent or in an organic solvent type solvent.

The liquid to be employed in the present invention is preferably an aqueous liquid, in consideration of ease of maintaining a satisfactory work environment and a smaller burden of the waste material on the environment as in the aforementioned photosensitive resin. An aqueous solvent for such aqueous liquid may be a liquid containing water by 50 wt. % or more and containing a lower alcohol such as methyl alcohol or ethyl alcohol, for increasing the drying speed, within a range less than 50 wt. %, or a liquid containing a component for promoting dissolution or improving stability of the metalorganic compound. Particularly from the standpoint of alleviating an environmental burden, there is preferred a water content of 70 wt. % or higher, more preferably a water content of 90 wt. % or higher, and most preferably water only.

(3) Producing Method for Conductive Film Pattern

A film pattern of a conductive film and/or a semiconductor film employing a photosensitive resin as the resin can be formed by a resin film forming step (coating step, drying step, exposure step and developing step), an absorption step of impregnating the resin film with the constituent of the conductive film or the semiconductor film, a rinsing step executed if necessary, a baking step and a milling step executed if necessary.

A coating step is a step of coating the aforementioned photosensitive resin on a substrate on which the film pattern is to be formed. The coating can be executed by various printing methods (such as screen printing, offset printing, or flexo printing), a spinner method, a dipping method, a spraying method, a stamping method, a roller method, a slit coater method or an ink jet method.

A drying step is a step of evaporating a solvent in the photosensitive resin film coated on the substrate in the coating step, thereby drying the coated film. The drying of the coated film may be executed at the room temperature, but is preferably executed under heating, in order to reduce a drying time. Drying under heating can be executed, for example, with an oven without air blowing, a dryer, or a hot plate. Though dependent on a formulation and a coating amount of the composition for forming electrode/wiring to be coated, the drying can be generally achieved by placing for 1-30 minutes at a temperature of 50-120° C.

An exposure step is a step of exposing the photosensitive resin film dried in the drying step, to a predetermined pattern, namely a pattern of a film to be produced (such as a predetermined shape of electrode or wiring). An area to be exposed by a light irradiation in the exposure step is different, depending on whether the photosensitive resin to be employed is a negative type or a positive type. In case of a negative type which becomes insoluble in the developer solution by the light irradiation, the exposure is executed by irradiating an area to be left of the resin film with a light, but, in case of a positive type which becomes soluble in the developer solution by the light irradiation, the exposure is executed by irradiating an area other than the area to be left of the resin film with a light. A selection of the light irradiated area and the light non-irradiated area can be made in a similar as in a mask formation in the ordinary photoresist.

A developing step is a step of eliminating, in the photosensitive resin film exposed in the exposure step, an area other than the area to be left of the resin film. In case of a negative photosensitive resin, a photosensitive resin film not subjected to a light irradiation is soluble in the developer solution while a photosensitive resin film subjected to a light irradiation is insoluble in the developer solution, so that the development can be executed by dissolving and removing, with the developer solution, the photosensitive resin film of a light non-irradiated area, not insolubilized in the developer solution. In case of a positive photosensitive resin, a photosensitive resin film not subjected to a light irradiation is insoluble in the developer solution while a photosensitive resin film subjected to a light irradiation is solubilized in the developer solution, so that the development can be executed by dissolving and removing, with the developer solution, the photosensitive resin film of a light irradiated area, solubilized in the developer solution.

In case of employing a water-soluble photosensitive resin, the developer solution can be water or similar to a developer solution employed for ordinary photoresists. Also in case of a resin soluble in an organic solvent, the developer solution can be an organic solvent or similar to a developer solution employed for photoresists of solvent type.

An absorption step for impregnating the resin film with a constituent of the conductive film or the semiconductor film is a step of causing the resin film formed in the foregoing steps, to absorb a liquid containing a constituent of the aforementioned conductive film or the semiconductor film. The absorption is executed by contacting the formed resin film with a liquid containing a constituent of the conductive film or the semiconductor film. More specifically, it can be achieved by a dipping method of immersing in the liquid containing the aforementioned constituent, or a coating method of coating the resin film with a liquid containing the constituent by a spray or a spin coating. Prior to the contact with the liquid containing the constituent, it is possible also, for example in case of employing the aforementioned aqueous liquid, to swell the resin film with the aqueous solvent.

A rinsing step is a step, after impregnating the resin film with the liquid containing the constituent of the conductive film or the semiconductor film, of rinsing and eliminating an excessive liquid adhering to the resin film or an excessive liquid adhering to a portion other than the resin film. The rinsing step can be executed by employing a rinsing liquid similar to the solvent in the liquid containing the constituent of the conductive film or the semiconductor film, and by a method of immersing the substrate bearing the resin film in such rinsing liquid or by a method of spraying the rinsing liquid to the substrate bearing the resin film.

An ultraviolet irradiation, constituting the essence of the present invention, is executed after the impregnation of the constituent of the conductive film or the semiconductor film in the resin film. The ultraviolet irradiation may be executed before the baking step, but is preferably executed in the baking step, before a constituent resin of the resin film under baking reaches a starting temperature of thermal decomposition.

An ultraviolet irradiation executed in the present invention is to facilitate a thermal decomposition of the constituent resin of the resin film, and is preferably executed, in order to achieve an efficient cleavage of a carbon bond of the constituent resin, with a wavelength of 172-254 nm, for about 1-30 minutes so as to obtain an exposure amount of 10-5000 mJ. The ultraviolet irradiation with a low-pressure mercury lamp can be executed in a short time, in an ozone atmosphere so as to achieve a more efficient cleavage of the carbon bond in the constituent resin. Also an ultraviolet irradiation with an excimer UV lamp can be executed in a shorter time under a nitrogen atmosphere.

As a light source for the ultraviolet light, there can be employed a low-pressure mercury lamp or an excimer UV lamp. The ultraviolet irradiation is executed at a shorter wavelength (172-254 nm) in comparison with the exposing ultraviolet irradiation (360-365 nm) in the exposure step and at a higher energy (several ten to several thousand millijoules), and requires an irradiation amount of several to several thousand times in comparison with the exposure amount in the photoprocess.

A baking step is a step of baking the resin film, subjected to the developing step and the absorption step and the rinsing step if necessary (namely the photosensitive resin film in the light irradiated area in the negative type or the photosensitive resin film in the light non-irradiated area in the positive type), to decompose and eliminate an organic component in the resin film, thereby forming a film pattern by the constituent of the conductive film or the semiconductor film contained in the resin film. The baking can be executed in the air, in case of forming a conductive film pattern with a precious metal, but may be executed in vacuum or in an oxygen-free atmosphere (for example in an inert gas atmosphere such as nitrogen) in case of forming a conductive film pattern with an easily oxidizable metal such as copper or palladium.

The baking, though dependent on the type of the organic component contained in the resin film, is generally executed for a period of several to several tens of minutes at a temperature of 400-600° C. The baking can be executed for example a hot-air circulating oven, a belt oven, a tact oven, a hot plate or an IR oven. The baking allows to obtain, on the substrate, a conductive film and/or a semiconductor film in a predetermined pattern. Particularly in the invention, since the baking can be executed after the constituent resin of the resin film is rendered easily thermally decomposable by the ultraviolet irradiation, the constituent resin does not easily generate residues at the baking, whereby the film pattern can be formed with an improved uniformity.

(5) Producing Method for Electron-Emitting Device

The film pattern forming method of the invention is applicable, as described before, to a producing method of an electron-emitting device, and, in the following, there will be explained an application to a producing method for a surface conduction electron-emitting device.

Figure 1B:
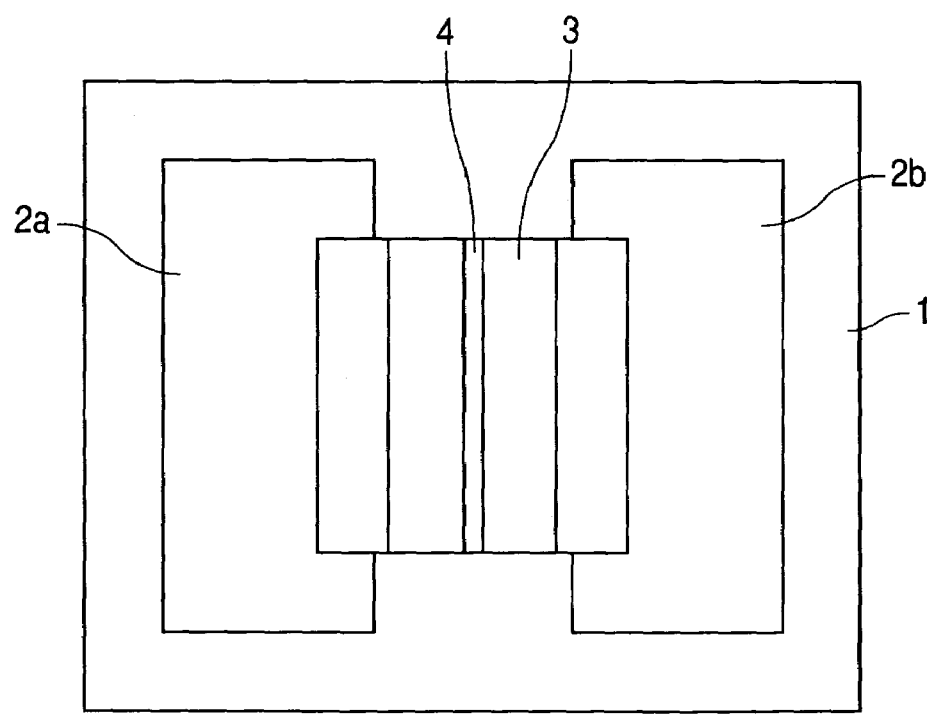

FIGS. 1A and 1B are respectively a cross-sectional view and a plan view, schematically showing a configuration of an electron-emitting device that can be produced by the film pattern producing method of the invention, wherein shown are a substrate 1, device electrodes 2a, 2b, a device film 3 and an electron emitting part 4.

As illustrated, the electron-emitting device of the invention includes a device film 3 bridging a pair of device electrodes 2a, 2b formed on the substrate 1. The device electrodes 2a, 2b and the device film 3 are formed as conductive film patterns, and, after the formation thereof, an energization process called a forming is applied between the device electrodes 2a, 2b to form an electron emitting part 4 in a part of the device film 3. The electron-emitting device is usually subjected, after the forming process, to an activation process of applying a voltage between the device electrodes 2a, 2b in the presence of an organic gas to deposit carbon in the electron emitting part 4 and a vicinity thereof, thereby improving the electron emitting efficiency.

As the device electrodes 2a, 2b and the device film 3 are formed as conductive film patterns as described above, either or both of these components can be formed by the film pattern forming method of the invention.

(6) Producing Method for Electron Source and Image Forming Apparatus

The film pattern forming method of the invention is also applicable, as described before, to a producing method for an electron source substrate or an image forming apparatus, and, in the following, there will be explained a producing method for an electron source substrate utilizing a surface conduction electron-emitting device and for an image forming apparatus utilizing the same.

Figure 2:
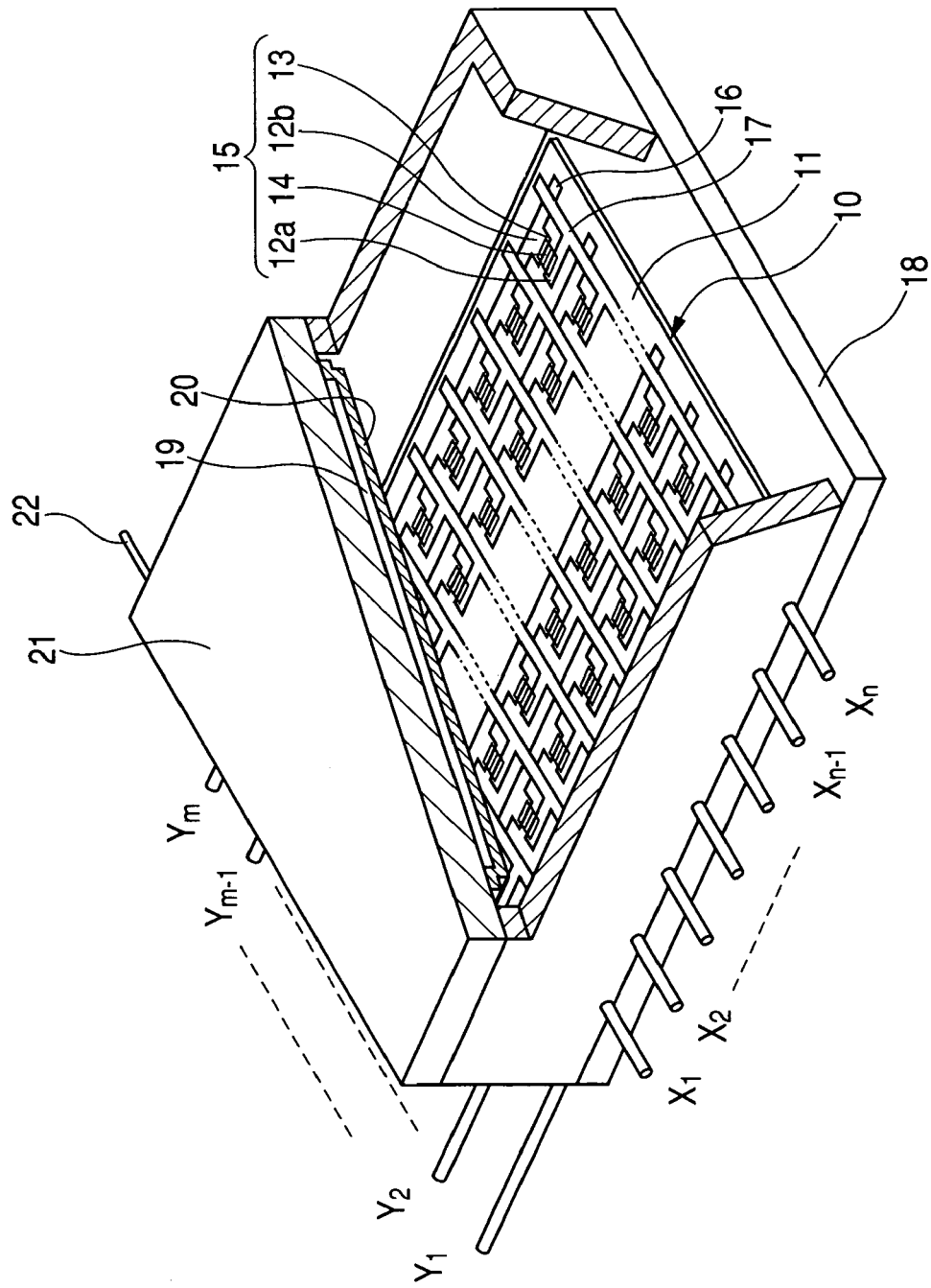
FIG. 2 is a partially cut-off perspective view schematically showing an image forming apparatus utilizing an electron source substrate that can be produced by the film pattern forming method of the invention.

FIG. 2 is a partially cut-off perspective view schematically showing an image forming apparatus, utilizing an electron source substrate that can be produced with the film pattern forming method of the invention.

An electron source substrate 10 has a simple matrix structure in which an electron-emitting device 15, having device electrodes 12a, 12b and a device film 13 including an electron emitting part 14 is provided, on a substrate 11, in plural units along X and Y directions and connected to Y-direction wirings (lower wirings) 16 and X-direction wirings (upper wirings) 17, and, the device electrode 2b of each electron-emitting device 15 is connected to the Y-direction wiring 16, while the device electrode 2a of each electron-emitting device 15 is connected to the X-direction wiring 17. The electron-emitting device 15 is basically similar to that shown in FIGS. 1A and 1B, and the substrate 11, the device electrodes 12a, 12b, the device film 13 and the electron emitting part 14 respectively correspond to the substrate 1, the device electrodes 2a, 2b, the device film 3 and the electron emitting part 4 in FIGS. 1A and 1B.

The electron source substrate is provided on a rear plate 18. Opposed to the electron source substrate provided on the rear plate 18, there is provided a face plate 21 having a phosphor film 19 and a metal back 20 on an internal surface, and a space between the rear plate 18 and the face plate 21 is sealed by a supporting frame 22 surrounding the periphery of the two to maintain a vacuum atmosphere therein.

This image forming apparatus constitutes an image display panel, in which a voltage is applied between the device electrodes 12a, 12b of an electron-emitting device 15 selected by lead terminals X1-Xn, Y1-Ym respectively connected to the X-direction wirings 17 and the Y-direction wirings 16 and a high voltage of 10-15 kV is applied from a high voltage terminal 22 to the metal back 20, thereby irradiating an electron beam emitted from the selected electron-emitting device 15 to the corresponding phosphor and thus displaying an image.

The electron source substrate 10 in the aforementioned image forming apparatus can be produced by forming device electrodes 12a, 12b of plural pairs, a device film 13 connecting each pair of the device electrodes 12a, 12b, Y-direction wirings 16 connected to the device electrodes 12b and X-direction wirings 17 connected to the device electrodes 12a, and energizing each pair of the device electrodes 12a, 12b thereby forming an electron emitting part 14 in each device film 13.

The device electrodes 12a, 12b, the device film 13, the Y-direction wirings 16 and the X-direction wirings 17 can be formed as conductive film patterns, and the electron source substrate 10 can be prepared by forming any or all of these components by the film pattern forming method of the invention. Also an image forming apparatus (image display panel) can be produced by positioning in an opposed relationship to a phosphor film 19, constituting an image forming member for forming an image by an electron beam irradiation.

EXAMPLES

Example 1

A photosensitive resin (methacrylic acid-methyl methacrylate-ethyl acrylate-n-butyl acrylate-azobisisobutyronitrile copolymer) was coated on an entire surface of a glass substrate (75 mm×75 mm×thickness 2.8 mm) and was dried for 2 minutes at 80° C. on a hot plate.

Then, with a photomask of a linear pattern of a line width shown in Table 1, a pattern-forming area of the photosensitive resin film was exposed with an ultra high-pressure mercury lamp (illumination intensity=1600 mW/cm$^2$), utilizing a Canon MPA 3200 (mirror projection mask aligner) with a scanning speed of 13 mm/sec and developed to obtain a resin pattern.

The substrate bearing the resin pattern was immersed in purified water for 30 seconds, and then immersed for 180 seconds in a Ru complex solution (aqueous solution of tris(2, 2'-bipyridyl)ruthenium (II) chloride, ruthenium content 0.1 wt. %) to cause the solution to be absorbed in the resin pattern.

Then the substrate was taken out, rinsed for 5 seconds under running water to wash off the Ru complex solution present between the resin patterns, then subjected to an elimination of liquid by blowing air, and dried for 3 minutes on a hot plate of 80° C. Then, after an ultraviolet irradiation of 2000 mJ with a low-pressure mercury lamp, a baking was conducted in a hot-air circulating oven for 1 hour at 500° C.

An obtained linear film pattern of ruthenium oxide was subjected to a measurement of a line width by a line width measuring instrument, and a linearity of the linear film pattern was evaluated by a fluctuation from the mask pattern (3σ/average, σ=standard deviation of samples). The line pattern had a width of 6, 8, 10, 20 or 50 μm and a length of 1000 μm, and, on each film pattern, the line width was measured at 90 points at a pitch of 10 μm.

Results are shown in Table 1.

Example 2

A substrate bearing a resin pattern, subjected to an impregnation with a Ru complex solution, a rinsing and a drying, was prepared in the same manner as in Example 1. The substrate was charged in a belt oven, subjected to an ultraviolet irradiation of 2000 mJ with a low-pressure mercury lamp at 200° C. and then baked at 500° C. in the belt oven.

An obtained ruthenium oxide film pattern was subjected to measurements and evaluation as in Example 1.

Obtained results are shown in Table 1.

Comparative Example 1

A linear film pattern of ruthenium oxide was obtained in the same manner as in Example 1 except that the ultraviolet irradiation with the low-pressure mercury lamp was not executed, and was subjected to measurements and evaluation as in Example 1.

Obtained results are shown in Table 1.

TABLE 1

| Mask line width (μm) | Fluctuation (%) | | |
|---|---|---|---|
| | Example 1 | Example 2 | Comp. Ex. 1 |
| 6 | 0.6 | 0.5 | 2.0 |
| 8 | 0.5 | 0.4 | 1.5 |
| 10 | 0.4 | 0.5 | 1.3 |
| 20 | 0.5 | 0.4 | 1.1 |
| 50 | 0.5 | 0.5 | 1.2 |

Also an electron-emitting device, produced by forming the device electrodes 2a, 2b shown in FIGS. 1A and 1B in the methods of the foregoing Examples showed satisfactory electron emitting characteristics with a high reproducibility.

Also in case of forming the device electrodes 12a, 12b of the electron-emitting devices 15 in the electron source substrate 10 shown in FIG. 2, by the methods described in the foregoing Examples, the electron emitting characteristics were uniform among the electron-emitting devices.

Also in case of forming the device electrodes 12a, 12b of the electron-emitting devices 15 and the Y-direction wirings (lower wirings) 16 and the X-direction wirings (upper wirings) 17 in the electron source substrate 10 shown in FIG. 2, by the methods described in the foregoing Examples, the electron emitting characteristics were more uniform among the electron-emitting devices.

Also a high reliable image display apparatus with a satisfactory display performance could be obtained by employing the electron source substrate 10 produced in the aforementioned method in the image display apparatus shown in FIG. 2.

In the foregoing examples, there have been shown cases of executing a baking and an ultraviolet irradiation once each, but the present invention is not limited to such example. For example, there can also be selected a method of executing an ultraviolet irradiation and a baking, and then further executing the ultraviolet irradiation and the baking plural times, and such method can be selected without departing the concept or spirit of the present invention.

This application claims priority from Japanese Patent Application No. 2004-253985 filed Sep. 1, 2004, which is hereby incorporated by reference herein.

What is claimed is:

1. A method for producing a film pattern comprising:
(a) patterning a resin film on a substrate surface;
(b) impregnating the patterned resin film with a constituent of a conductive film or a semiconductor film;
(c) after the patterning step (a) and the impregnating step (b), irradiating the resin film containing the constituent of the conductive film or the semiconductor film with ultraviolet radiation; and
(d) after the irradiating step (c), heating the resin film containing the constituent of the conductive film or the semiconductor film at a temperature not lower than a decomposition temperature of the resin to modify the resin film into the conductive film or the semiconductor film.

2. A film pattern producing method according to claim 1, wherein the ultraviolet irradiation is conducted while heating the resin film containing the constituent of the conductive film or the semiconductor film.

3. A film pattern producing method according to claim 1, wherein the ultraviolet irradiation step (c) is conducted in the presence of ozone.

4. A film pattern producing method according to claim 1, wherein the resin film is formed of a resin containing an ion exchange group.

5. A film pattern producing method according to claim 1, wherein the constituent of the conductive film or the semiconductor film is either one selected from gold, silver, copper, ruthenium, palladium, rhodium, bismuth, vanadium, chromium, tin, lead, silicon, zinc, indium and nickel.

6. A film pattern producing method according to claim 1, wherein the constituent of the conductive film or the semiconductor film is a metal complex.

7. A film pattern producing method according to claim 1, wherein the constituent of the conductive film or the semiconductor film is impregnated into the resin film in an aqueous liquid.

8. A method for producing an electronic device including a substrate provided with a circuit having a conductive or semiconductor film pattern in at least a part thereof, wherein at least a part of the film pattern is formed by a film pattern producing method according to claim 1.

9. A method for producing an electron-emitting device including a conductive film pattern, wherein the film pattern is formed by a film pattern producing method according to claim 1.

10. A method for producing an electron source substrate including plural electron-emitting devices formed on a substrate and wirings for driving the electron-emitting devices in which at least a part of the electron-emitting devices and the wirings is formed by a conductive film pattern, wherein at least a part of the film pattern is formed by a film pattern producing method according to claim 1.

11. A method for producing an image forming apparatus, which comprises positioning an electron source substrate obtain by a producing method according to claim 10, in an opposed relationship to a substrate having an image forming member capable of forming an image by an electron beam irradiation.

12. A film pattern producing method according to claim 1, wherein the step (b) of impregnating the resin film with a constituent of a conductive film or a semiconductor film is conducted after the step (a) of patterning the resin film formed on the substrate surface.

13. A method for producing a film pattern comprising:
  (a) patterning a resin film on a substrate surface;
  (b) impregnating the patterned resin film with a constituent of a conductive film or a semiconductor film;
  (c) after the patterning step (a) and the impregnating step (b), irradiating the entire resin film which contains the constituent of the conductive film or the semiconductor film with ultraviolet radiation; and
  (d) after the irradiating step (c), heating the resin film which contains the constituent of the conductive film or the semiconductor film at a temperature not lower than a decomposition temperature of the resin to modify the resin film into the conductive film or the semiconductor film.

* * * * *